(12) United States Patent
Seo et al.

(10) Patent No.: US 9,590,641 B2
(45) Date of Patent: Mar. 7, 2017

(54) SEMICONDUCTOR APPARATUS AND REGULATION CIRCUIT THEREOF

(71) Applicant: SK hynix Inc., Icheon-si, Gyeonggi-do (KR)

(72) Inventors: Young Suk Seo, Icheon-si (KR); Da In Im, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 155 days.

(21) Appl. No.: 14/458,355

(22) Filed: Aug. 13, 2014

(65) Prior Publication Data

US 2015/0365078 A1 Dec. 17, 2015

(30) Foreign Application Priority Data

Jun. 11, 2014 (KR) ........................ 10-2014-0070818

(51) Int. Cl.
 *H03L 7/06* (2006.01)
 *H03L 7/085* (2006.01)
 *H03L 7/081* (2006.01)

(52) U.S. Cl.
 CPC ............ *H03L 7/085* (2013.01); *H03L 7/0814* (2013.01)

(58) Field of Classification Search
 CPC ......... H03K 3/013; H03K 3/012; H03L 7/085
 USPC ....... 327/158, 156, 310, 538, 540–543, 378, 327/379, 157, 159, 161–163, 144–155, 327/387–389; 375/371–376; 331/17, 74; 323/280, 282
 See application file for complete search history.

(56) References Cited

U.S. PATENT DOCUMENTS

| | | | | |
|---|---|---|---|---|
| 6,229,364 B1 * | 5/2001 | Dortu | ..................... | H03K 5/131 327/158 |
| 2004/0130357 A1 * | 7/2004 | Smith | ................ | H03K 19/0016 327/102 |
| 2004/0183588 A1 * | 9/2004 | Chandrakasan | ........ | G05F 3/205 327/545 |
| 2005/0062507 A1 * | 3/2005 | Naffziger | .................. | H03L 7/07 327/105 |
| 2009/0115505 A1 | 5/2009 | Lee et al. | | |

OTHER PUBLICATIONS

Lin, T. H., et al, "Power Noise Suppression Technique using Active Decoupling Capacitor for TSV 3D Integration", 23rd IEEE International SOC Conference, Las Vegas, NV, 2010, pp. 209-212.*
Jie Gu et al., On-Chip Supply Noise Regulation Using a Low-Power Digital Switched Decoupling Capacitor Circuit, IEEE Journal of Solid-State Circuits, Jun. 2009, vol. 44, No. 6.
Michael Ang, et al. An On-chip Voltage Regulator using Switched Decoupling Capacitors, IEE International Solid-State Circuits Conference, 2000, Palo Alto, CA.

* cited by examiner

*Primary Examiner* — Lincoln Donovan
*Assistant Examiner* — Thomas Skibinski
(74) *Attorney, Agent, or Firm* — William Park & Associates Ltd.

(57) ABSTRACT

A regulation circuit of a semiconductor apparatus includes a control block configured to generate control signals in response to a reference clock signal and a feedback clock signal; and a noise compensation block configured to compensate for a variation in a level of power in response to the control signals.

13 Claims, 6 Drawing Sheets

SEMICONDUCTOR APPARATUS AND REGULATION CIRCUIT THEREOF

CROSS-REFERENCES TO RELATED APPLICATION

The present application claims priority under 35 U.S.C. §119(a) to Korean application number 10-2014-0070818, filed on Jun. 11, 2014, in the Korean Intellectual Property Office, which is incorporated herein by reference in its entirety.

BACKGROUND

1. Technical Field

Various embodiments generally relate to a semiconductor apparatus, and more particularly, to a semiconductor apparatus and a regulation circuit thereof.

2. Related Art

A semiconductor apparatus includes internally various operation circuit blocks, and power supply is essential to the operations thereof.

Noise may be applied to the interior of the semiconductor apparatus through a power line from an exterior, or may be generated internally of the semiconductor apparatus and exert an influence on power.

If noise is included in power, the level of the power may not be constantly retained, and is likely to rise or fall.

Such power noise may decrease the operation timing margin of the semiconductor apparatus, may increase jitters and skews of the signals generated in the semiconductor apparatus, and as a result, may serve as a factor that lowers the operation speed of the semiconductor apparatus.

SUMMARY

In an embodiment, a regulation circuit of a semiconductor apparatus may include a control block configured to generate control signals in response to a reference clock signal and a feedback clock signal. The regulation circuit may also include a noise compensation block configured to compensate for a variation in a level of power in response to the control signals.

In an embodiment, a regulation circuit of a semiconductor apparatus may include a delay-locked loop configured to output a delay-locked clock signal in response to an output enable signal. The regulation circuit may also include a noise compensation block configured to compensate for a variation in a level of power in response to the output enable signal.

In an embodiment, a semiconductor apparatus may include: a delay-locked loop configured to generate a delay-locked clock signal by delaying a reference clock signal by a delay time corresponding to a phase difference between the reference clock signal and a feedback clock signal, and generate control signals in response to the reference clock signal and the feedback clock signal; and a noise compensation block configured to compensate for a variation in a level of power applied through a power line, in response to the control signals.

DETAILED DESCRIPTION

Hereinafter, a semiconductor apparatus and a regulation circuit will be described below with reference to the accompanying drawings through various embodiments. A semiconductor apparatus and a regulation circuit thereof, which may reduce power noise, are described herein.

Figure 1:
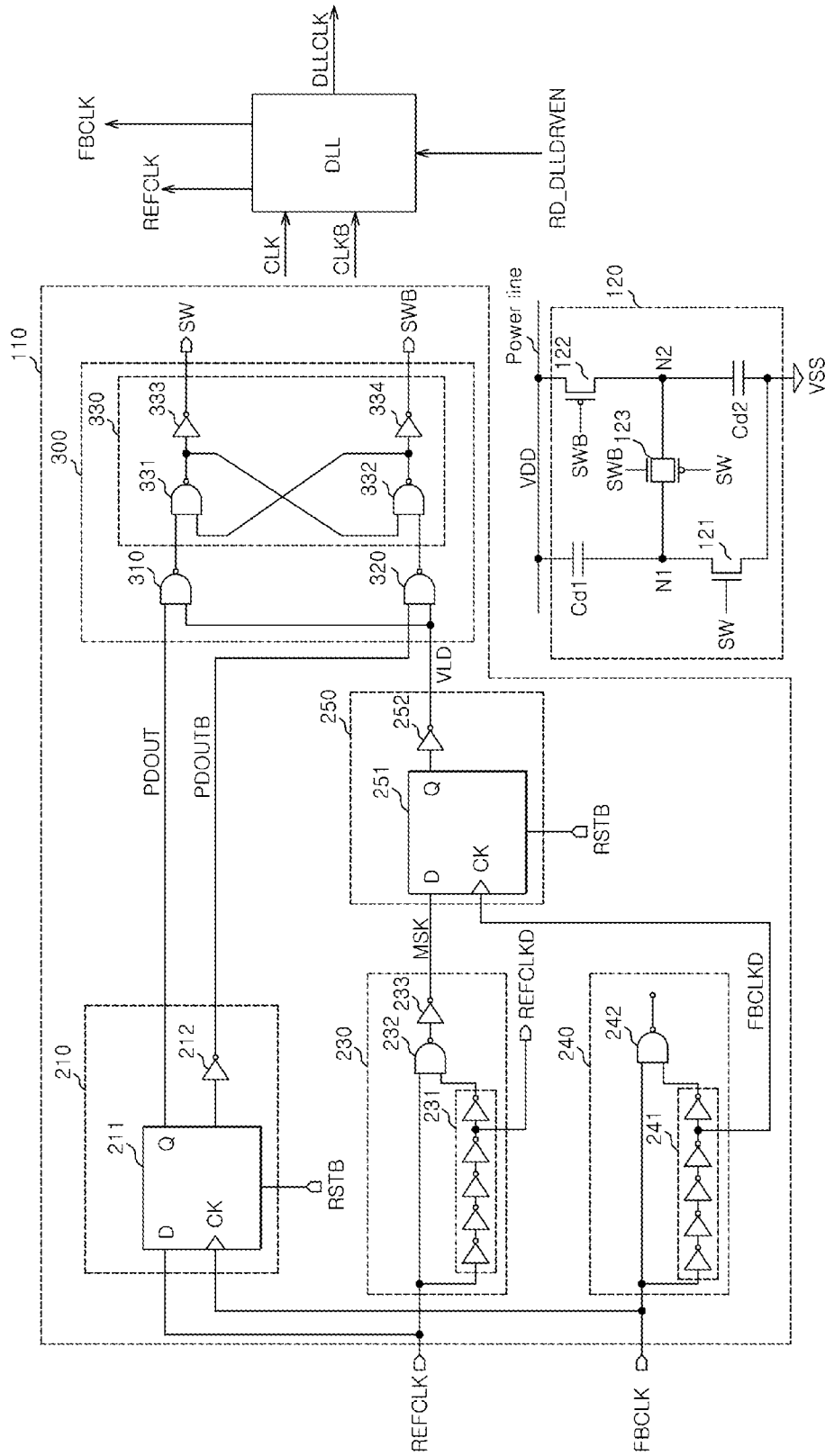
FIG. 1 is a block diagram showing the configuration of a regulation circuit 100 of a semiconductor apparatus in accordance with an embodiment.

Referring to FIG. 1, a regulation circuit 100 of a semiconductor apparatus in accordance with an embodiment may include a control block 110, and a noise compensation block 120.

The regulation circuit 100 of a semiconductor apparatus may further include a delay-locked loop DLL.

The delay-locked loop DLL may be configured to generate a delay-locked clock signal DLLCLK in response to clock signals CLK and CLKB.

The delay-locked loop DLL may also be configured to output the delay-locked clock signal DLLCLK in response to activation of an output enable signal RD_DLLDRVEN.

The control block 110 may be configured to generate control signals SW and SWB according to a reference clock signal REFCLK and a feedback clock signal FBCLK.

The control block 110 may be configured to generate the control signals SW and SWB according to the phase difference between the reference clock signal REFCLK and the feedback clock signal FBCLK.

The control block 110 may be configured to determine the noise degree of a power line according to the phase difference between the reference clock signal REFCLK and the feedback clock signal FBCLK. The control block 110 may also transition the control signals SW and SWB according to the phase difference between the reference clock signal REFCLK and the feedback clock signal FBCLK when a determined noise value is greater than a reference value.

The control block 110 may be configured to determine the noise degree of the power line according to the phase difference between the reference clock signal REFCLK and the feedback clock signal FBCLK. Further, the control block 110 may also prevent a transition of the control signals SW and SWB when a determined noise value is smaller than the reference value.

The control block 110 may include a phase detection unit 210, a mask signal generation unit 230, a delay unit 240, a valid signal generation unit 250, and a control signal generation unit 300.

The phase detection unit 210 may be configured to detect the phase difference between the reference clock signal REFCLK and the feedback clock signal FBCLK. The phase detection unit 210 may also generate phase difference detection signals PDOUT and PDOUTB.

The phase detection unit 210 may include a flip-flop 211 and an inverter 212.

The flip-flop 211 may be configured to latch the reference clock signal REFCLK by the rising edge of the feedback clock signal FBCLK. The flip-flop 211 may also generate the phase difference detection signal PDOUT.

The flip-flop 211 may be initialized in response to a reset signal RSTB. Further, the flip-flop 211 may also output the phase difference detection signal PDOUT at a low level.

The inverter 212 may be configured to invert the phase difference detection signal PDOUT. In addition, the inverter 212 may also generate the phase difference detection signal PDOUTB.

The mask signal generation unit 230 may be configured to generate a mask signal MSK using the reference clock signal REFCLK.

The mask signal generation unit 230 may include an inverter array 231, a NAND gate 232, and an inverter 233.

The mask signal MSK may be a pulse signal with a high level period corresponding to the delay time of the inverter array 231 from the rising edge of the reference clock signal REFCLK.

One of the internal signals of the inverter array 231, or more specifically, a signal generated by delaying the reference clock signal REFCLK, may be outputted as a delayed reference clock signal REFCLKD.

The delay unit 240 may be configured to delay the feedback clock signal FBCLK. The delay unit 240 may also generate a delayed feedback clock signal FBCLKD.

The delayed feedback clock signal FBCLKD may be generated by delaying the feedback clock signal FBCLK by the same delay value as the delay value of the delayed reference clock signal REFCLKD.

The delay unit 240 may include an inverter array 241. A NAND gate 242 serves as a dummy element for timing compensation with respect to the NAND gate 232 of the mask signal generation unit 230.

The valid signal generation unit 250 may be configured to detect the phase difference between the mask signal MSK and the delayed feedback clock signal FBCLKD. The valid signal generation unit 250 may also generate a valid signal VLD.

The valid signal generation unit 250 may include a flip-flop 251 and an inverter 252.

The flip-flop 251 may latch the mask signal MSK by the rising edge of the delayed feedback clock signal FBCLKD. In addition, the inverter 252 may invert the latched signal and generate the valid signal VLD.

The flip-flop 251 may be initialized in response to the reset signal RSTB. Accordingly, the valid signal VLD may be outputted at a high level.

The control signal generation unit 300 may be configured to generate the control signals SW and SWB in response to the phase difference detection signals PDOUT and PDOUTB in the case where the valid signal VLD is activated, or more specifically, where the valid signal VLD transitions from a low level to the high level, after the control signal generation unit 300 is initialized.

The control signal generation unit 300 may be configured to retain the control signals SW and SWB at previous levels regardless of the phase difference detection signals PDOUT and PDOUTB where the valid signal VLD is deactivated to the low level.

The control signal generation unit 300 may a plurality of NAND gates 310 and 320, and a latch 330.

The latch 330 may include a plurality of NAND gates 331 and 332. The latch may also include a plurality of inverters 333 and 334.

The noise compensation block 120 may be configured to compensate for a variation of a power level due to noise, in response to the control signals SW and SWB.

The noise compensation block 120 may include a plurality of decoupling capacitors Cd1 and Cd2 electrically coupled between the power line and a ground terminal VSS. The noise compensation block 120 may also include a plurality of switches 121 to 123 configured to electrically couple in parallel or in series the plurality of decoupling capacitors Cd1 and Cd2 in response to the control signals SW and SWB.

The noise compensation block 120 may include first and second decoupling capacitors Cd1 and Cd2, and first to third switches 121 to 123.

The first decoupling capacitor Cd1 has one end electrically coupled with the power line and the other end electrically coupled to a node N1.

The first switch 121 is electrically coupled between the node N1 and the ground terminal VSS.

The second switch 122 has one end electrically coupled to the power line and an other end electrically coupled with a node N2.

The second decoupling capacitor Cd2 is electrically coupled between the node N2 and the ground terminal VSS.

The third switch 123 is electrically coupled between the node N1 and the node N2.

The first switch 121 electrically couples the first decoupling capacitor Cd1 with the ground terminal VSS in response to the control signal SW.

The second switch 122 electrically couples the second decoupling capacitor Cd2 with the power line in response to the control signal SWB.

The first switch 121 and the second switch 122 electrically couple in parallel the first decoupling capacitor Cd1 and the second decoupling capacitor Cd2 between the power line and the ground terminal VSS, when the control signals SW and SWB are respectively a high level and a low level.

The third switch 123 electrically couples in series the first decoupling capacitor Cd1 and the second decoupling capacitor Cd2 between the power line and the ground terminal VSS. Moreover, the third switch 123 electrically couples in series the first and second decoupling capacitors Cd1 and Cd2 when the control signals SW and SWB are respectively a low level and a high level.

Referring to FIG. 1, as a representation of an example of designing the first and second decoupling capacitors Cd1 and Cd2 to be electrically coupled in parallel in an initial operation is shown.

In an embodiment, when compensating for a rise and a fall in the level of power VDD due to noise, a hysteresis characteristic may be applied.

A rise and a fall in the level of the power VDD due to noise increase the above-described phase difference between the reference clock signal REFCLK and the feedback clock signal FBCLK of the delay-locked loop DLL. The degree of the phase difference may be within or out of a delay locking operation enabling range.

If the phase difference between the reference clock signal REFCLK and the feedback clock signal FBCLK is within the delay locking operation enabling range, it is possible to control the reference clock signal REFCLK and the feedback clock signal FBCLK to have the same phase, by the operation of the delay-locked loop DLL. Accordingly, in this case, the operation of the noise compensation block 120 may be unnecessary.

If the phase difference between the reference clock signal REFCLK and the feedback clock signal FBCLK is out of the delay locking operation enabling range, it may not be possible to control the reference clock signal REFCLK and the feedback clock signal FBCLK to have the same phase, by the operation of the delay-locked loop DLL.

In an embodiment, the noise compensation block 120 may be operated only when the phase difference between the reference clock signal REFCLK and the feedback clock signal FBCLK is out of the delay locking operation enabling range.

As a reference to determine if the phase difference between the reference clock signal REFCLK and the feedback clock signal FBCLK is out of the delay locking operation enabling range, the mask signal MSK may be used.

The mask signal MSK as a signal generated according to the reference clock signal REFCLK is a high level pulse with a predetermined pulse width on both sides of the rising edge of the delayed reference clock signal REFCLKD.

The pulse width of the mask signal MSK may serve as a reference value to determine whether the phase difference between the reference clock signal REFCLK and the feedback clock signal FBCLK is out of the delay locking operation enabling range.

In the initial rising or falling period of the level of the power VDD, the rising edge of the delayed feedback clock signal FBCLKD is present within the high pulse period of the mask signal MSK. Accordingly, the delay-locked loop DLL may trace the phase difference between the reference clock signal REFCLK and the feedback clock signal FBCLK and control the reference clock signal REFCLK and the feedback clock signal FBCLK to have the same phase.

Where the rising edge of the delayed feedback clock signal FBCLKD is present within the high pulse period of the mask signal MSK, the valid signal VLD is deactivated to the low level.

If the valid signal VLD is deactivated to the low level, the control signals SW and SWB retain previous values.

When the level of the power VDD continuously rises or continuously falls, the rising edge of the delayed feedback clock signal FBCLKD goes out of the high pulse period of the mask signal MSK. As a result, it is difficult for the delay-locked loop DLL to trace the phase difference between the reference clock signal REFCLK and the feedback clock signal FBCLK and control the reference clock signal REFCLK and the feedback clock signal FBCLK to have the same phase.

If the rising edge of the delayed feedback clock signal FBCLKD goes out of the high pulse period of the mask signal MSK, the valid signal VLD is activated to the high level.

If the valid signal VLD is activated to the high level, the control signals SW and SWB may be changed to values corresponding to the phase difference detection signals PDOUT and PDOUTB.

Figure 2:
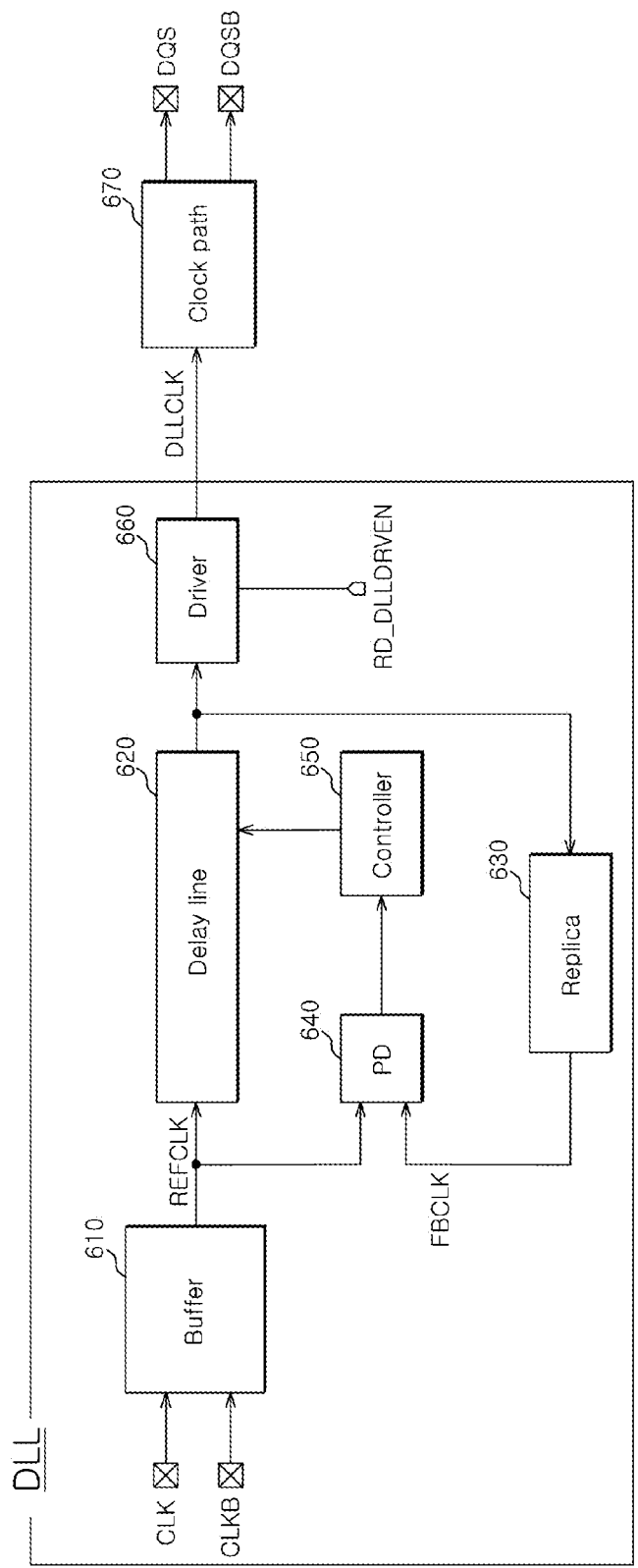
FIG. 2 is a block diagram showing the configuration of the delay-locked loop DLL of FIG. 1.

Referring to FIG. 2, the delay-locked loop DLL may include a buffer 610, a delay line 620, a replica 630, a phase detector (PD) 640, a controller 650, and a driver 660.

The buffer 610 may be configured to buffer the clock signals CLK and CLKB and generate the reference clock signal REFCLK.

The delay line 620 delays the reference clock signal REFCLK by a time variable according to the control of the controller 650. The delay line 620 also outputs a resultant signal.

The replica 630 delays the output signal of the delay line 620 by a time preset through replicating the internal delay time of the semiconductor apparatus. The replica 630 also generates the feedback clock signal FBCLK.

The phase detector 640 detects the phase difference between the reference clock signal REFCLK and the feedback clock signal FBCLK. Further, the phase detector 640 also provides the phase difference to the controller 650.

The controller 650 controls the delay line 620 according to the output of the phase detector 640 such that the reference clock signal REFCLK and the feedback clock signal FBCLK have the same phase.

The driver 660 outputs the delay-locked clock signal DLLCLK in response to activation of the output enable signal RD_DLLDRVEN.

The output enable signal RD_DLLDRVEN may be activated in a read operation.

The delay-locked clock signal DLLCLK may be outputted as strobe signals DQS and DQSB via a clock path 670.

Figure 3:
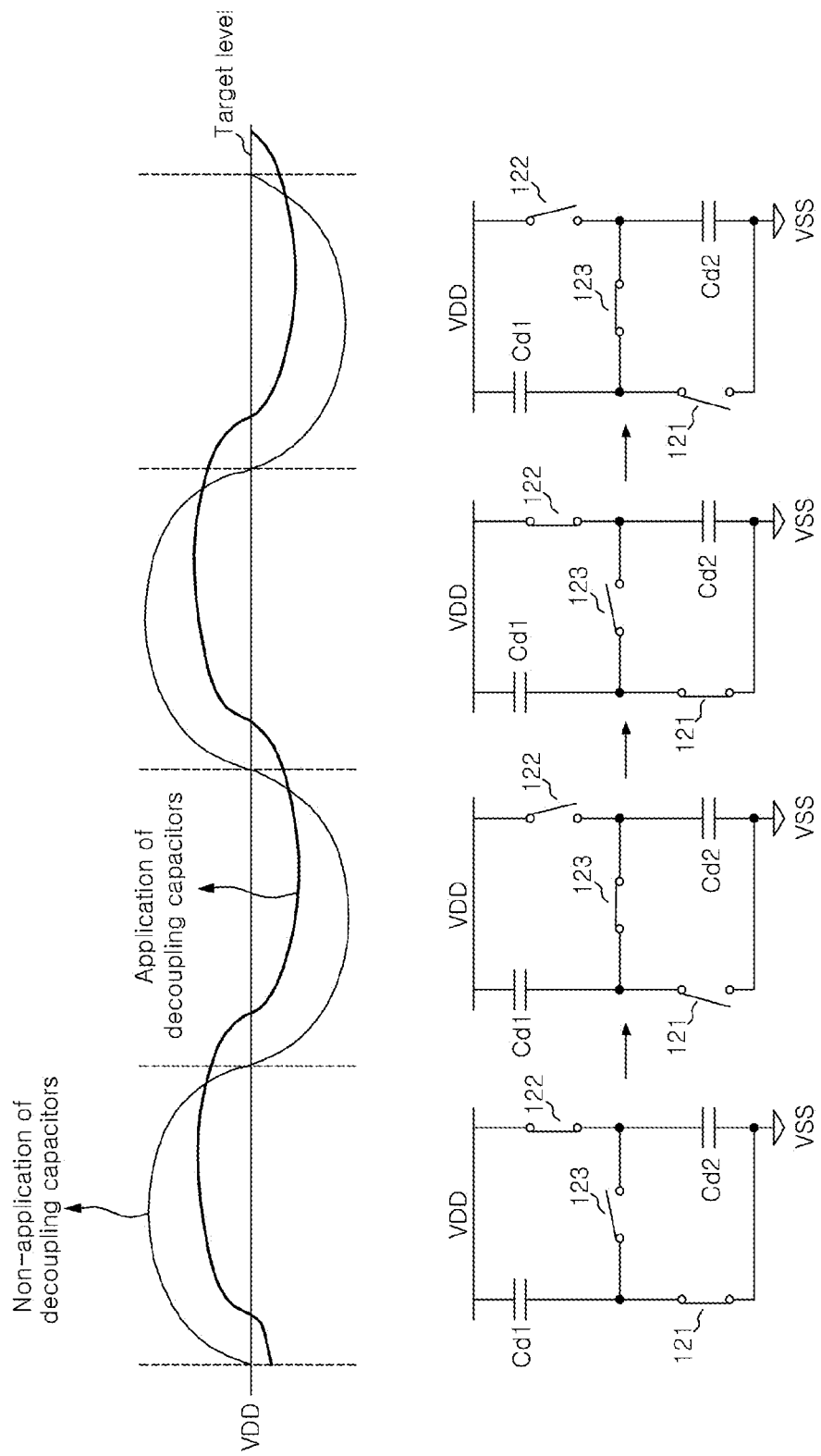
FIG. 3 is a diagram showing the operation scheme of the noise compensation block 120 of FIG. 1 and power level changes according to the operation scheme.

The operation scheme of the noise compensation block 120 of FIG. 1 and power level changes according to the operation scheme will be described with reference to FIG. 3.

It may be ideal that the level of the power VDD be retained constantly at a target level. However, under actual operation circumstances, the level of the power VDD may rise or fall due to noise generated as described above.

If the level of the power VDD rises, the first and second switches 121 and 122 are turned on. In addition, the first decoupling capacitor Cd1 and the second decoupling capacitor Cd2 are electrically coupled in parallel.

As the first decoupling capacitor Cd1 and the second decoupling capacitor Cd2 are electrically coupled in parallel, a total charge capacity by the first decoupling capacitor Cd1 and the second decoupling capacitor Cd2 increases.

As the level of the power VDD rises, charges an amount of which exceeds a target amount accumulate in a power circuit electrically coupled with the power line to supply power.

Accordingly, as the first decoupling capacitor Cd1 and the second decoupling capacitor Cd2 electrically coupled in parallel are charged with the charges accumulated in the power circuit electrically coupled to the power line, the level of the power VDD falls.

If the level of the power VDD falls, the third switch 123 is turned on. In addition, the first decoupling capacitor Cd1 and the second decoupling capacitor Cd2 are electrically coupled in series.

As the first decoupling capacitor Cd1 and the second decoupling capacitor Cd2 are electrically coupled in series, a total charge capacity by the first decoupling capacitor Cd1 and the second decoupling capacitor Cd2 decreases as compared to where the first decoupling capacitor Cd1 and the second decoupling capacitor Cd2 are electrically coupled in parallel.

Therefore, as the first decoupling capacitor Cd1 and the second decoupling capacitor Cd2 electrically coupled in series discharge, or supply, the charges accumulated therein, to the power circuit electrically coupled to the power line, the level of the power VDD rises.

Accordingly, it is possible to compensate for the level of the power VDD by performing a noise compensating operation using decoupling capacitors that are described above.

Figure 4:
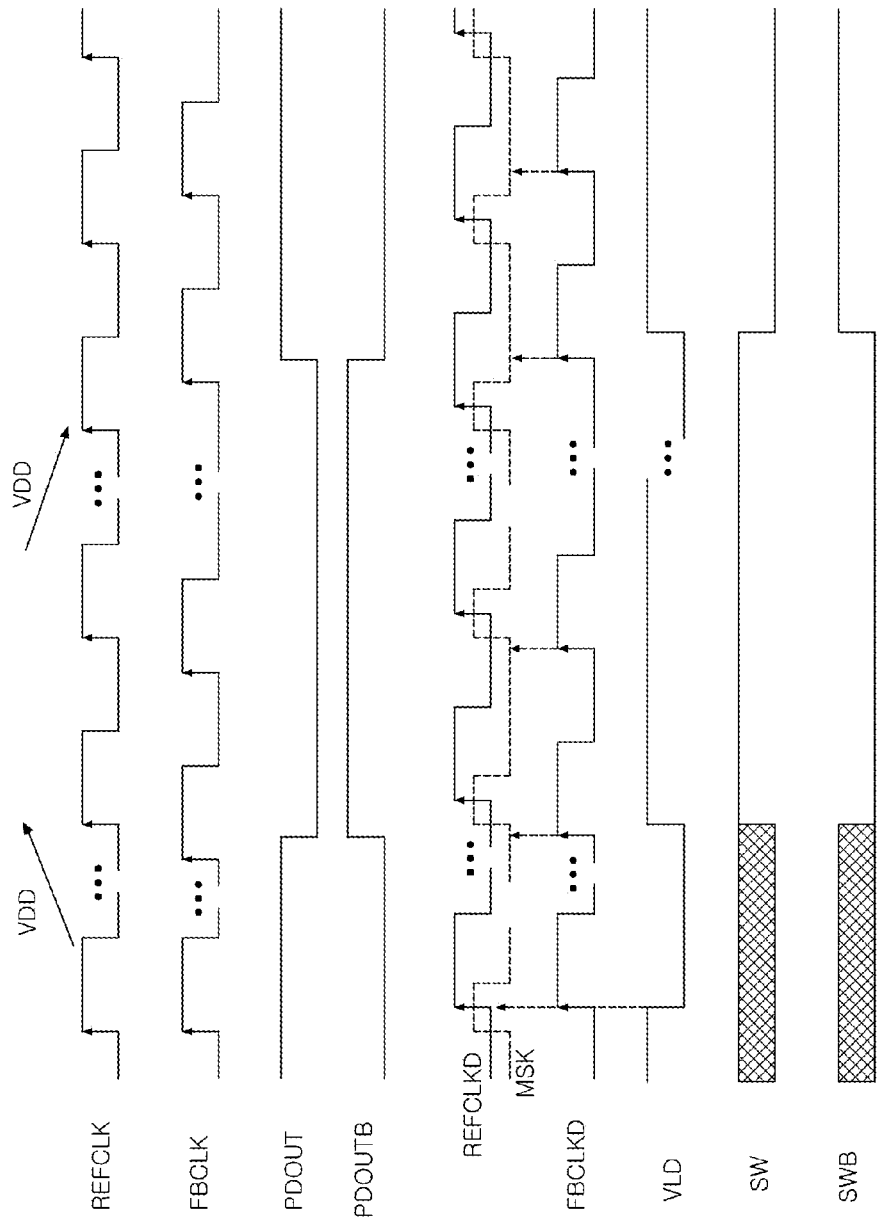
FIG. 4 is an operation timing diagram of the regulation circuit 100 of a semiconductor apparatus in accordance with an embodiment.

Operations of the regulation circuit 100 of a semiconductor apparatus in accordance with an embodiment will be described below with reference to FIG. 4.

In an embodiment, a rise and a fall in the level of the power VDD due to noise is determined according to the phase difference between the feedback clock signal FBCLK and the reference clock signal REFCLK. Accordingly, compensation is made through the charge and discharge operations of the first and second decoupling capacitors Cd1 and Cd2 of the noise compensation block 120.

In the initial operation, when the reset signal RSTB has a low level, the phase difference detection signals PDOUT and PDOUTB are outputted respectively at the low level and a high level. In addition, the valid signal VLD is outputted at the high level. Further, the control signals SW and SWB are outputted respectively at the high level and the low level.

That is to say, FIG. 1 according to an embodiment, shows a representation of an example of designing the first and second decoupling capacitors Cd1 and Cd2 to be electrically coupled in parallel in the initial operation.

Thereafter, if the level of the power VDD rises, the phase of the feedback clock signal FBCLK becomes earlier than the reference clock signal REFCLK due to a change in the operational characteristics of the internal elements of the delay-locked loop DLL, such as a decrease in the delay time of the delay line 620.

When the phase of the feedback clock signal FBCLK is earlier than the reference clock signal REFCLK, the phase difference detection signals PDOUT and PDOUTB have the values of the lower level and the high level.

In this instance, if the valid signal VLD has the low level, the control signals SW and SWB are retained at values in an initializing operation regardless of the values of the phase difference detection signals PDOUT and PDOUTB.

If the valid signal VLD has the high level, the control signals SW and SWB have the values of the high level and the low level, respectively.

When the control signals SW and SWB have the high level and the low level, as described above with reference to FIG. 3, the first and second switches 121 and 122 are turned on. In addition, the first decoupling capacitor Cd1 and the second decoupling capacitor Cd2 electrically coupled in parallel perform the charge operations and lower the level of the power VDD which has risen due to noise.

If the level of the power VDD falls, the phase of the reference clock signal REFCLK becomes earlier than the feedback clock signal FBCLK due to an increase in the delay time of the delay line 620 of the delay-locked loop DLL.

When the phase of the reference clock signal REFCLK is earlier than the feedback clock signal FBCLK, the phase difference detection signals PDOUT and PDOUTB have the values of a high level and a low level.

At this time, if the valid signal VLD has the low level, the control signals SW and SWB retain the previous values, that is, the high level and the low level, regardless of the values of the phase difference detection signals PDOUT and PDOUTB.

If the valid signal VLD has the high level, the control signals SW and SWB transition to the low level and the high level according to the phase difference detection signals PDOUT and PDOUTB.

When the control signals SW and SWB have the low level and the high level, as described above with reference to FIG. 3, the third switch 123 is turned on. In addition, the first decoupling capacitor Cd1 and the second decoupling capacitor Cd2 electrically coupled in series perform the discharge operations and raise the level of the power VDD which has fallen due to noise.

A regulation circuit 101 of a semiconductor apparatus in an embodiment shows an example in which the output enable signal RD_DLLDRVEN to control the output of the delay-locked clock signal DLLCLK in the delay-locked loop DLL is used to control discharge and charge operations according to parallel and serial coupling of decoupling capacitors.

The output enable signal RD_DLLDRVEN is a signal which is activated to a high level, in a read operation of the semiconductor apparatus.

Only when the semiconductor apparatus performs the read operation, the delay-locked clock signal DLLCLK is outputted. Accordingly, the clock path 670 is activated.

In the read operation, due to the activation of the clock path 670, power noise, that is, a fall in a power level may occur.

If the read operation is completed, the output enable signal RD_DLLDRVEN becomes a low level, and accordingly, the clock path 670 is deactivated.

As the clock path 670 is deactivated, the power level rises.

More specifically, a fall and a rise in the power level may be determined according to the level of the output enable signal RD_DLLDRVEN.

Figure 5:
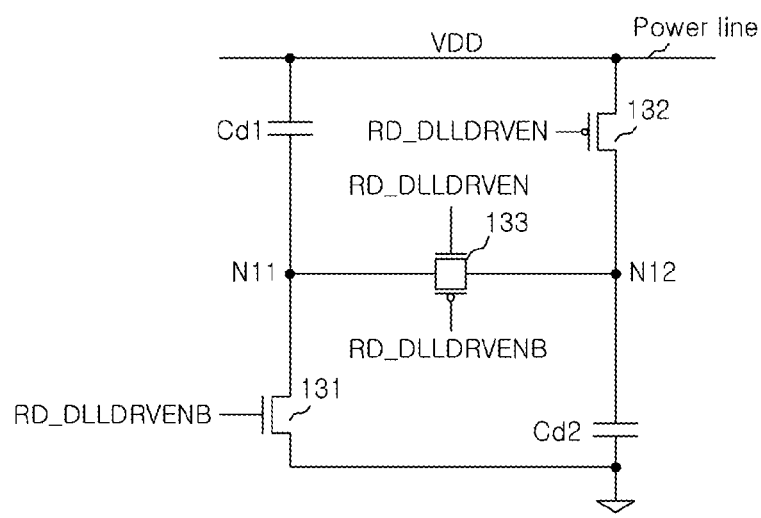
FIG. 5 is a circuit diagram of a regulation circuit 101 of a semiconductor apparatus in accordance with an embodiment.
Figure 5:
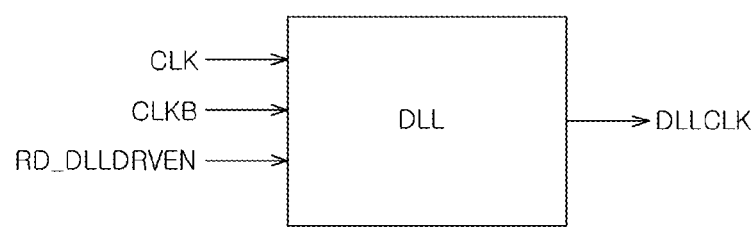

Referring to FIG. 5, the regulation circuit 101 of a semiconductor apparatus in accordance with an embodiment may include first and second decoupling capacitors Cd1 and Cd2, and first to third switches 131 to 133.

The regulation circuit 101 of a semiconductor apparatus may further include a delay-locked loop DLL.

The delay-locked loop DLL may use the same configuration as shown in FIG. 2.

The first decoupling capacitor Cd1 has one end electrically coupled with a power line and an other end electrically coupled to a node N11.

The first switch 131 is electrically coupled between the node N11 and a ground terminal.

The second switch 132 has one end electrically coupled to the power line and an other end electrically coupled with a node N12.

The second decoupling capacitor Cd2 is electrically coupled between the node N12 and the ground terminal.

The third switch 133 is electrically coupled between the node N11 and the node N12.

The first switch 131 electrically couples the first decoupling capacitor Cd1 with the ground terminal in response to a negative output enable signal RD_DLLDRVENB.

The negative output enable signal RD_DLLDRVENB may be generated by inverting the output enable signal RD_DLLDRVEN.

The second switch 132 electrically couples the second decoupling capacitor Cd2 with the power line in response to the output enable signal RD_DLLDRVEN.

The first switch 131 and the second switch 132 electrically couple in parallel the first decoupling capacitor Cd1 and the second decoupling capacitor Cd2 between the power line and the ground terminal, when the negative output enable signal RD_DLLDRVENB and the output enable signal RD_DLLDRVEN are respectively a high level and a low level.

The third switch 133 electrically couples in series the first decoupling capacitor Cd1 and the second decoupling capacitor Cd2 between the power line and the ground terminal, when the negative output enable signal RD_DLLDRVENB and the output enable signal RD_DLLDRVEN are respectively a low level and a high level.

In the read operation, if the output enable signal RD_DLLDRVEN is the high level and the negative output enable signal RD_DLLDRVENB is the low level, the third switch 133 electrically couples in series the first decoupling capacitor Cd1 and the second decoupling capacitor Cd2.

As the first decoupling capacitor Cd1 and the second decoupling capacitor Cd2 are electrically coupled in series, a total charge capacity by the first decoupling capacitor Cd1 and the second decoupling capacitor Cd2 decreases when compared to where the first decoupling capacitor Cd1 and the second decoupling capacitor Cd2 are electrically coupled in parallel.

Therefore, as the first decoupling capacitor Cd1 and the second decoupling capacitor Cd2 electrically coupled in series discharge, or supply, the charges accumulated therein, to a power circuit electrically coupled to the power line, the level of power VDD rises.

As the read operation is completed, if the output enable signal RD_DLLDRVEN is the low level and the negative output enable signal RD_DLLDRVENB is the high level, the first switch 131 and the second switch 132 electrically couple in parallel the first decoupling capacitor Cd1 and the second decoupling capacitor Cd2.

As the first decoupling capacitor Cd1 and the second decoupling capacitor Cd2 are electrically coupled in parallel, a total charge capacity by the first decoupling capacitor Cd1 and the second decoupling capacitor Cd2 increases.

As the level of the power VDD rises, charges an amount of which exceeds a target amount accumulate in the power circuit electrically coupled with the power line to supply power.

Therefore, as the first decoupling capacitor Cd1 and the second decoupling capacitor Cd2 electrically coupled in parallel are charged with the charges accumulated in the power circuit electrically coupled to the power line, the level of the power VDD falls.

Figure 6:
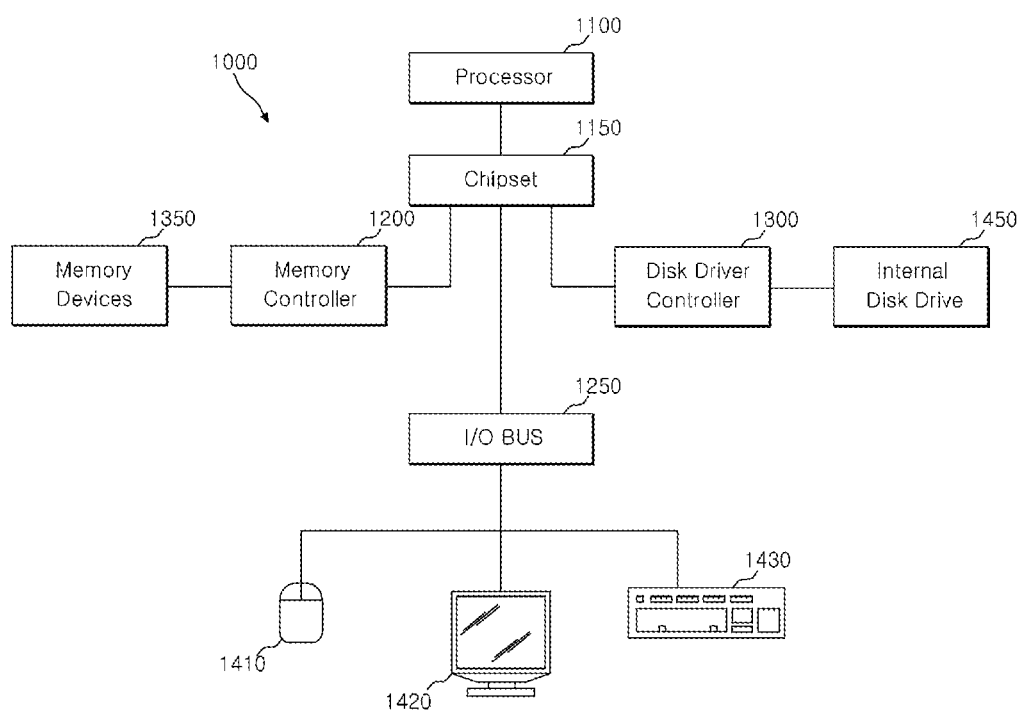
FIG. 6 illustrates a block diagram of a system employing a memory controller circuit in accordance with an embodiment of the invention.

Referring to FIG. 6, a system 1000 may include one or more processors 1100. A chipset 1150 may be operably electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420 and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While various embodiments have been described above, it will be understood to those skilled in the art that the embodiments described are by way of example only.

Accordingly, the semiconductor apparatus and the regulation circuit thereof described herein should not be limited based on the described embodiments.

What is claimed is:

1. A regulation circuit of a semiconductor apparatus, comprising:
    a control block configured to generate control signals in response to a reference clock signal and a feedback clock signal; and
    a noise compensation block configured to compensate for a variation in a level of power in response to the control signals;
    wherein the control block comprises:
    a phase difference detection unit configured to detect the phase difference between the reference clock signal and the feedback clock signal, and generate phase difference detection signals;
    a mask signal generation unit configured to generate a mask signal in response to the reference clock signal;
    a valid signal generation unit configured to detect a phase difference between the mask signal and a delayed feedback clock signal generated by delaying the feedback clock signal, and generate a valid signal; and
    a control signal generation unit configured to generate the control signals in response to the valid signal and the phase difference detection signals.

2. The regulation circuit according to claim 1, further comprising:
    a delay-locked loop configured to generate a delay-locked clock signal by using the reference clock signal generated by buffering external clock signals and the feedback clock signal which is generated by delaying the reference clock signal.

3. The regulation circuit according to claim 1, wherein the control block is configured to determine a noise degree of the power according to a phase difference between the reference clock signal and the feedback clock signal, and transition the control signals according to the phase difference between the reference clock signal and the feedback clock signal when a determined noise value is larger than a reference value.

4. The regulation circuit according to claim 3, wherein the control block is configured to prevent a transition of the control signals when the noise value is smaller than the reference value.

5. The regulation circuit according to claim 1, wherein the control block comprises:
    a phase difference detection unit configured to detect the phase difference between the reference clock signal and the feedback clock signal, and generate phase difference detection signals; and
    a control signal generation unit configured to generate the control signals in response to the phase difference detection signals.

6. The regulation circuit according to claim 1, wherein the mask signal is a pulse signal with a predetermined pulse width on both sides of a rising edge of a delayed reference clock signal generated by delaying the reference clock signal.

7. The regulation circuit according to claim 1, wherein the reference value is determined according to the pulse width of the mask signal.

8. The regulation circuit according to claim 1, wherein the valid signal generation unit is configured to output a signal generated by latching the mask signal by the delayed feedback clock signal, as the valid signal.

9. The regulation circuit according to claim 1, wherein the control signal generation unit is configured to determine the transition of the control signals in response to the phase difference detection signals when the valid signal is activated.

10. The regulation circuit according to claim 9, wherein the control signal generation unit is configured to retain the control signals at previous values regardless of the phase difference detection signals when the valid signal is deactivated.

11. The regulation circuit according to claim 1, wherein the noise compensation block comprises:
   a plurality of decoupling capacitors electrically coupled between the power line and a ground terminal; and
   a plurality of switches configured to electrically couple in parallel or in series the plurality of decoupling capacitors in response to the control signals.

12. A semiconductor apparatus comprising:
   a delay-locked loop configured to generate a delay-locked clock signal by delaying a reference clock signal by a delay time corresponding to a phase difference between the reference clock signal and a feedback clock signal;
   a control block configured to generate control signals in response to the reference clock signal and the feedback clock signal; and
   a noise compensation block configured to compensate for a variation in a level of power in response to the control signals;
   wherein the control block comprises:
   a phase difference detection unit configured to detect the phase difference between the reference clock signal and the feedback clock signal, and generate phase difference detection signals;
   a mask signal generation unit configured to generate a mask signal in response to the reference clock signal;
   a valid signal generation unit configured to detect a phase difference between the mask signal and a delayed feedback clock signal generated by delaying the feedback clock signal, and generate a valid signal; and
   a control signal generation unit configured to generate the control signals in response to the valid signal and the phase difference detection signals.

13. The semiconductor apparatus according to claim 12, wherein the noise compensation block comprises:
   a plurality of decoupling capacitors electrically coupled between the power line and a ground terminal; and
   a plurality of switches configured to electrically couple in parallel or in series the plurality of decoupling capacitors according to the control signals.

* * * * *